United States Patent [19]

Nakayama

[11] Patent Number: 5,801,650

[45] Date of Patent: Sep. 1, 1998

[54] DECODING APPARATUS AND METHOD

[75] Inventor: Tadayoshi Nakayama, Tokyo, Japan

[73] Assignee: Canon Kabushiki Kaisha, Tokyo, Japan

[21] Appl. No.: 566,583

[22] Filed: Nov. 28, 1995

[30] Foreign Application Priority Data

Nov. 29, 1994 [JP] Japan .................. 6-295281

[51] Int. Cl.$^6$ .................. H03M 7/40
[52] U.S. Cl. .................. 341/67
[58] Field of Search .................. 341/67, 65, 106

[56] References Cited

U.S. PATENT DOCUMENTS

| | | | |
|---|---|---|---|
| 4,044,347 | 8/1977 | Van Voorhis | 341/67 |
| 4,516,246 | 5/1985 | Kenemuth | 375/37 |
| 4,700,175 | 10/1987 | Bledsoe | 340/347 |
| 4,899,149 | 2/1990 | Kahan | 341/67 |

*Primary Examiner*—Brian K. Young
*Attorney, Agent, or Firm*—Fitzpatrick, Cella, Harper & Scinto

[57] ABSTRACT

An unpacking circuit 103 takes the top 16-bit data from an input code after eliminating previously decoded data on the basis of code length information 106. An operation unit 501 obtains a redundant code number of a Huffman code inputted from the unpacking circuit 103 and upper three bits of the code length information 106. By referring to a decoding table 503, an eight-bit fixed-length data and the least significant bit of the code length information are obtained correspondence with an input nine-bit redundant code number signal 502. Therefore, memory size required for storing the decoding table 503 is $2^9 \times 9$ bits=576 bytes, thus, comparing to a case where memory size for storing the decoding table of 96 kbytes when changing into a fixed code length by using only the decoding table, it is possible to use a decoding table of smaller size.

20 Claims, 11 Drawing Sheets

FIG. 5

| CODE NUMBER | HUFFMAN CODE | CODE LENGTH |
|---|---|---|
| 0 | 0 | 1 |
| 1 | 100 | 3 |
| 2 | 101 | 3 |
| 3 | 1100 | 4 |
| 4 | 1101 | 4 |
| 5 | 1110 | 4 |
| 6 | 11110 | 5 |
| 7 | 111110 | 6 |
| 8 | 111111 | 6 |

FIG. 6

| i | LOWER BOUNDARY VALUE OF i-BIT LENGTH CODE (SIX BITS) | CORRESPONDING HUFFMAN CODE | CODE LENGTH |
|---|---|---|---|
| 1 | 000000 | 0 | 0 |
| 2 | 100000 | 100 | 1 |
| 3 | 100000 | 100 | 1 |
| 4 | 110000 | 1100 | 3 |
| 5 | 111100 | 11110 | 6 |
| 6 | 111110 | 111110 | 7 |

FIG. 10

| HUFFMAN CODE | REDUNDANT CODE NUMBER |
|---|---|
| 0 | 0, 1 |
| 100 | 2, 3 |
| 101 | 4, 5 |
| 1100 | 6 |
| 1101 | 7 |
| 1110 | 8 |
| 11110 | 9, 10 |
| 111110 | 11 |
| 111111 | 12 |

DECODING APPARATUS AND METHOD

BACKGROUND OF THE INVENTION

The present invention relates to a decoding apparatus and method and, more particularly, to a decoding apparatus and method for decoding a variable length code, such as a Huffman code.

Techniques for compressing digital signals have progressed rapidly. Regarding compression methods for compressing digitized signals of a still image and a moving picture, the compression methods which are suggested by JPEG (Joint Photographic Experts Group) and by MPEG (Moving Picture Experts Group) have become common as international standard methods.

In these compression methods, after an image signal is orthogonally transformed by using DCT (Discrete Cosine Transform), the amount of information is reduced by removing signal components corresponding to an image section which does not appeal to the eyes, then Huffman coding is applied so as to further reduce the data requirement. The Huffman coding is a coding method in which variable length codes are assigned to a fixed-length code in accordance with occurrence frequency of the fixed-length code. More specifically, the amount of information is reduced by assigning a shorter bit length code to data which occurs more frequently. When a Huffman code is to be decoded by using a table, the memory size of the table conflicts with decoding speed, and either one of the following two methods can be selected.

(1) A method using a table which requires small memory size to store it but decoding at low speed.

(2) A decoding method at high speed but using a table which requires large memory size to store it.

One extreme of the method (1) is to decode one bit per one decoding cycle, thus it takes several decoding cycles for decoding one Huffman code. In contrast, one extreme of the method (2) is to decode one Huffman code in one decoding cycle. Of course, there are intermediate methods, e.g., a method in which two or more bits are decoded per one decoding cycle.

In any of above methods, a Huffman code to be decoded is used unchanged to refer to a table without being transformed into other type of information, or a part of the Huffman code is combined with previously decoded information before referring to the table.

FIG. 1 is a block diagram illustrating a configuration of an apparatus for decoding one Huffman code in one decoding cycle, and the apparatus decodes a Huffman code whose maximum code length is 16 bits into a fixed-length code of 8 bits.

In FIG. 1, reference numeral 101 denotes an input terminal used for inputting Huffman-coded data, and reference numeral 102 denotes a buffer for temporally storing the input data. The reason why the buffer 102 is necessary is that, since the Huffman code is variable in length, if the rate of outputting data is fixed when decoding the data, then the rate of inputting data is not fixed.

Reference numeral 103 denotes an unpacking circuit for unpacking data which are inputted by m-bit, i.e., taking the top 16 bits after previously decoded data is removed. Reference numeral 104 denotes a decoding table used for decoding a Huffman code in the 16-bit data; 105, an output terminal for outputting a decoded fixed-length code (8 bits); and 106, a four-bit signal indicating bit length of the decoded Huffman code, which is sent to the unpacking circuit 103 and used to remove previously decoded data. As for the four-bit signal 106, there are cases where the signal 106 directly indicates bit length and where the signal 106 indicates (bit length−1). In FIG. 1, the signal 106 represents (bit length−1). More specifically, if the maximum code length of a Huffman code is 16 bits, then 5 bits are necessary to directly express the code length, whereas 4 bits can represent the maximum 16 bits by expressing the code length with (bit length−1) where a one-bit code length is expressed with '0000', since 0 bit code length does not exist. Note that, if the maximum code length of a Huffman code is not a value of 2 to the n-th power (n is an integer), it makes no difference whether it is represented by the code length or represented by (bit length−1).

In the configuration shown in FIG. 1, memory size required for the decoding table 104 is 96 kbytes, since the table 104 needs 16-bit input and 12-bit output, as shown in a following equation.

$$2^{16} \times 12 = 64 \ kbits \times 12 = 768 \ kbits = 96 \ kbytes \quad (1)$$

FIG. 2 is a block diagram illustrating a configuration of a decoding apparatus when a configuration shown in FIG. 1 is applied to a JPEG decoding method.

In the JPEG decoding method, a Huffman code having maximum code length of 16 bits is decoded into a fixed-length code of 8 bits (4 bits for a NNNN signal which represents a count and 4 bits for a SSSS signal which represents a group number). Further, since information called "additional bits" is inserted between Huffman codes, a function to pick up the additional bits is necessary in order to decode the Huffman codes. If the maximum bit length of the additional bits is ten bits, then a signal outputted by an unpacking circuit 200 shown in FIG. 2 must be a 26-bit signal. The top 16 bits of the 26-bit signal is transmitted to the decoding table 104, and transformed into a fixed-length code of eight bits and code length information 106 of four bits. Whereas, the 26-bit signal is transmitted to a shifter 201 where a decoded Huffman code is removed from the 26-bit signal in accordance with the code length information 106 (this can be done by shifting the 26-bit signal by the code length of the Huffman code), and the top 10 bits out of the remaining bits are outputted to a terminal 202. Note that not all the 10-bit signals outputted from the shifter 201 are additional bit signals, and only a few upper bits represented by the SSSS signal which is outputted from the decoding table 104 are the additional bit signals.

When one Huffman code is to be decoded after a previous Huffman code has been decoded, as described above, with the apparatus whose configuration is shown in FIG. 1, it is only necessary to remove the previously decoded data by using the bit length of a decoded Huffman code, whereas, with the apparatus whose configuration is shown in FIG. 2, the additional bit signals are also to be removed. Thus, the code length information 106 is added to a signal 203 (SSSS signal) expressing the bit length of the additional bits, at an adder 204, and the added signal is sent to the unpacking circuit 200 where both a Huffman code and additional bits are removed by one decoding cycle.

However, following problems arise in the aforesaid conventional technique.

More specifically, when a Huffman code is to be decoded at high speed, memory size required for storing the decoding table becomes large, thus resulting in following problems.

(1) In a case where a decoding apparatus is constituted with an integrated circuit, an area for chip is large, thus increasing cost for producing it.

(2) It takes considerable time to update a decoding table.

(3) Since the amount of information of a decoding table is large, it is impossible to apply Huffman coding which is the most suitable to the information to be coded in accordance with the information (e.g., image information).

(4) When a decoding table which is most suitable for each compressed information is provided in the compressed information so as to overcome the problem (3), the amount of information increases, which makes a merit of compressing the information go in vain, in other words, a merit of coding the information by using the most suitable coding method is lost.

SUMMARY OF THE INVENTION

The present invention has been made in consideration of the above situation, and has as its object to provide a decoding apparatus and method capable of performing high speed decoding by using a table which requires small memory size to store it.

According to the present invention, the foregoing object is attained by providing a decoding apparatus comprising: operation means for obtaining a part of code length information of an input code and a predetermined code number corresponding to the input code; and transformation means for transforming the code number obtained by the operation means into a fixed-length code and a rest of the code length information.

According to an aspect of the present invention, the above decoding apparatus further comprises: input means for inputting a code; and unpacking means for providing a predetermined number of bits of data extracted from the code inputted by the input means to the operation means as the input code on the basis of the part of code length information obtained by the operation means and the rest of the code length information obtained by the transformation means.

Further, according to another aspect of the present invention, the transformation means is a decoding table stored in a memory.

Furthermore, according to still another aspect of the present invention the decoding apparatus further comprises: input means for inputting a code; and unpacking means for providing a predetermined number of bits of data extracted from the code inputted by the input means to the operation means as the input code on the basis of the code length information obtained by the operation means.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 5 is a table showing correspondence between Huffman codes and code numbers;

FIG. 6 is a table showing correspondence among lower boundary values of i-bit length codes, Huffman codes, and code numbers;

FIG. 10 is a table showing correspondence between Huffman codes and redundant code numbers;

DETAILED DESCRIPTION OF THE PREFERRED EMBODIMENTS

Preferred embodiments of the present invention will be described in detail in accordance with the accompanying drawings.

The aforesaid problems can be overcome by using a decoding apparatus which utilizes a smaller memory size for storing a decoding table. The brief configuration of the decoding apparatus will be described below. Namely, in the decoding apparatus, a code length and a code number of a Huffman code to be decoded are obtained by using an operation/logic circuit, and an original fixed-length code is obtained in accordance with the code number by referring to a decoding table, thereby greatly reducing the memory size required for storing the decoding table.

The code number will be explained briefly. When Huffman codes are assigned to fixed-length codes, the fixed-length codes are ordered in descending order of occurrence frequency, and the number, such as 0, 1, 2, . . . , corresponding to the descending order is called the code number. Therefore, the minimum number of bits which is necessary to express the code number is never larger than the number of bits of the fixed-length code, and the minimum number of bits is always less or equal to the number of bits of the fixed-length code. It should be noted that the aforesaid two numbers of bits are normally the same, thus, this embodiment is explained under assumption that they are same.

[Configuration]

Figure 1:
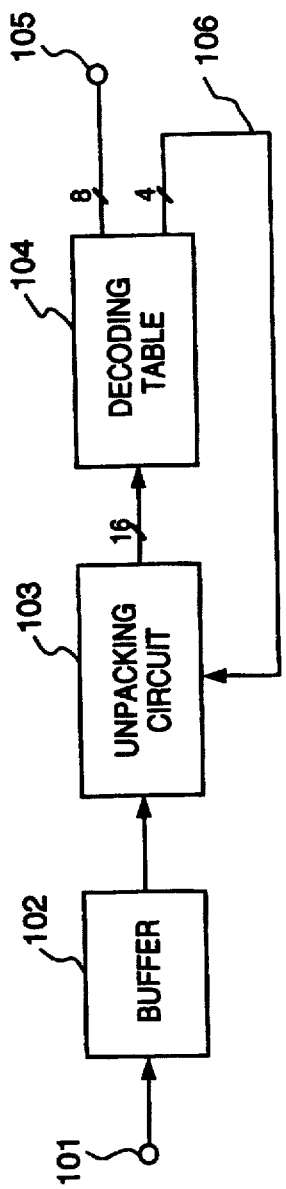
FIG. 1 is a block diagram illustrating a configuration of a decoding apparatus which decodes a single Huffman code in one decoding cycle.
Figure 2:
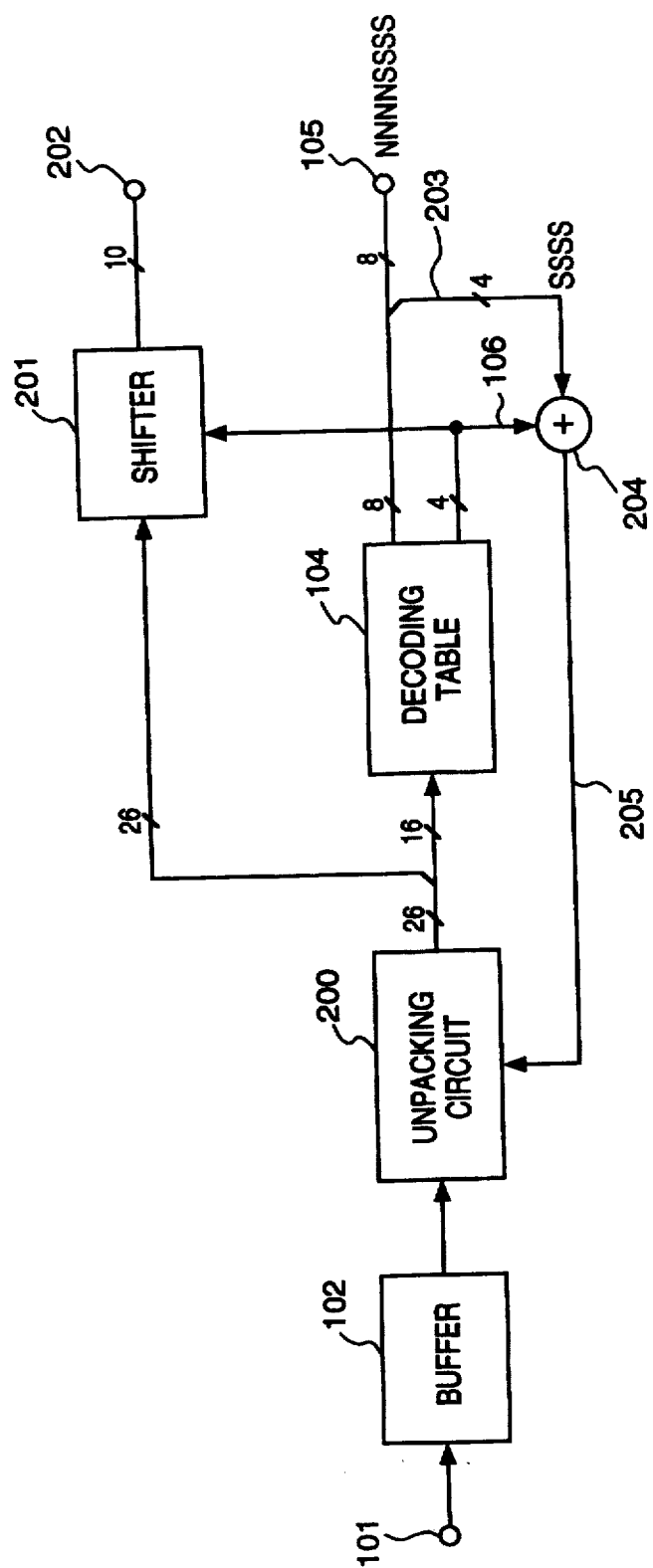
FIG. 2 is a block diagram illustrating a configuration of a decoding apparatus when the coding apparatus shown in FIG. 1 is applied to a JPEG decoding method.
Figure 3:
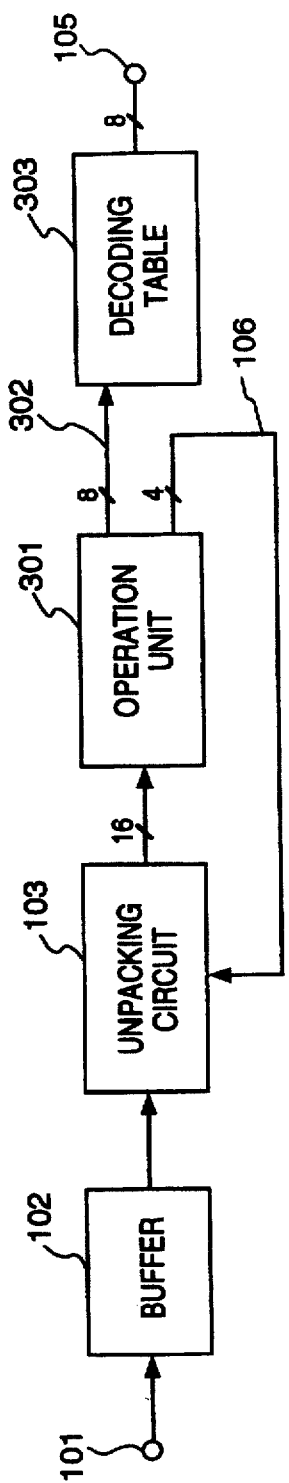
FIG. 3 is a block diagram illustrating a configuration of a decoding apparatus where memory size required for storing a decoding table is reduced.

FIG. 3 is a block diagram showing a configuration of the aforesaid decoding apparatus. Note that the same units and elements as those in FIG. 1 are referred by the same reference numerals and explanations of those are omitted. Further, in order to compare the configuration shown in FIG. 3 to the configuration shown in FIG. 1, the number of bits of a Huffman code and the number of bits of code length information in this embodiment are the same as those described above with reference to FIG. 1. Furthermore, in the configuration shown in FIG. 3, the operation/logic circuit is used to obtain a code number and a code length. The configuration of circuit will be described later with reference to FIG. 4.

In FIG. 3, reference numeral 301 denotes an operation unit to which a Huffman code is inputted from the unpacking circuit 103 and which obtains a code number and a code length of the input Huffman code by performing logical operations. Reference 303 denotes a decoding table, and by referring to the decoding table 303, an eight-bit fixed-length code is obtained correspondence to an eight-bit code number signal 302. As described above, by obtaining a code number from a Huffman code by performing logical operations in the operation unit 301, the number of input bits and the number of output bits to/from a decoding table 303 are both 8 bits. Therefore, memory size required to store the decoding table 303 is 256 bytes as seen from the equation (2). Comparing to the decoding table 104 (requires 96 kbytes) shown in FIG. 1, 1/384 of memory size required in FIG. 1 is enough to store the decoding table 303.

$$2^8 \times 8 = 256 \times 8 \text{ bits} = 256 \text{ bytes} \qquad (2)$$

Next, a configuration of the operation unit 301 and its operation will be described. For the simplicity sake, a small circuit for obtaining a four-bit code number and three-bit code length from nine combinations of Huffman codes whose maximum lengths are 6 bits will be described.

Figure 4:
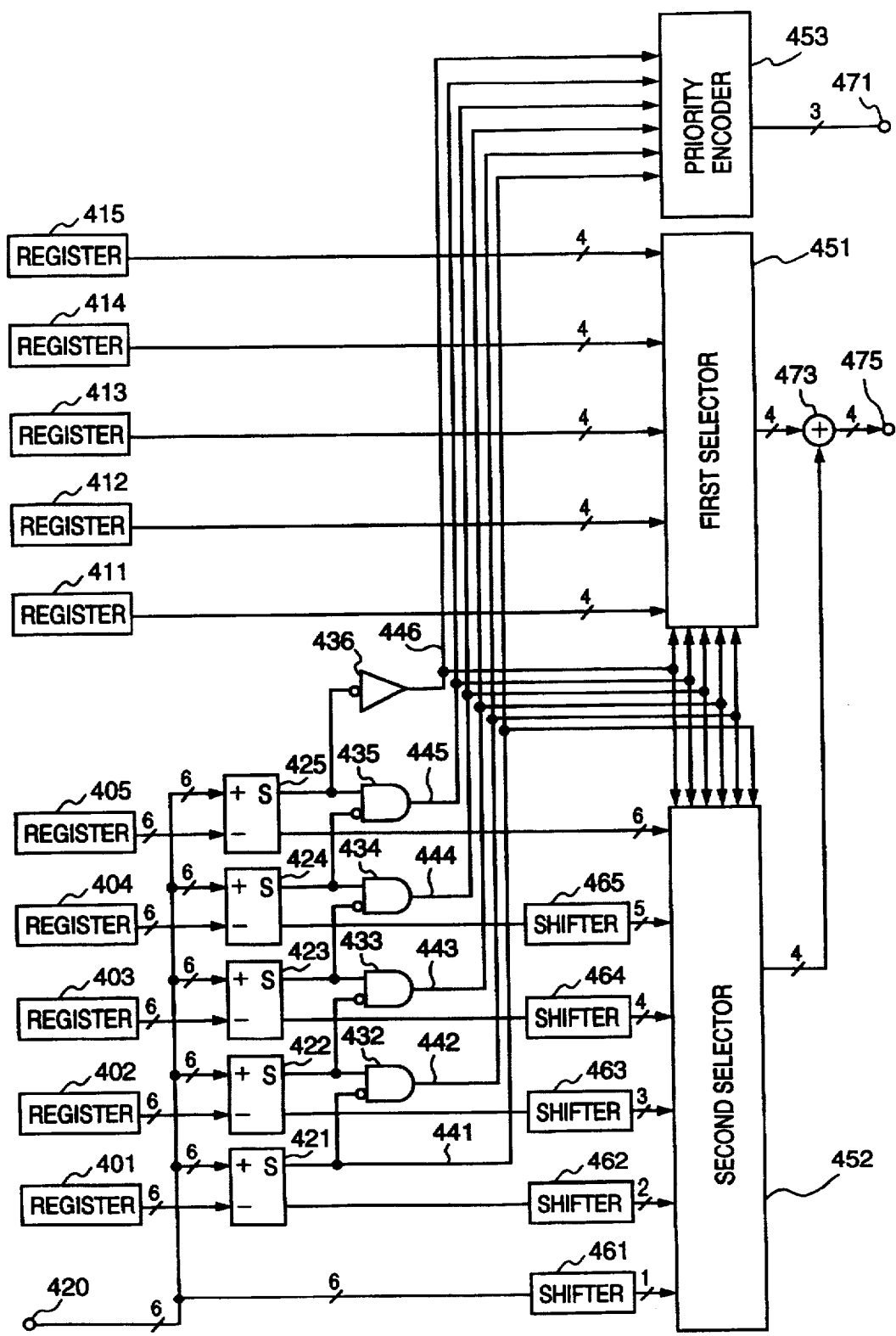
FIG. 4 is a block diagram illustrating a configuration of an operation unit shown in FIG. 3.

FIG. 4 is a block diagram showing a configuration of the operation unit 301, FIG. 5 is a table showing correspondence between Huffman codes and code numbers, and FIG. 6 is a table showing correspondence among lower boundary values of i-bit length codes, Huffman codes, and code numbers, where "i" is 1, 2, 3, 4, 5, and 6. The lower boundary value of an i-bit length code is a boundary value (6 bits) between a code whose length is i-bit and a code whose length is less than i-bit when Huffman codes are ordered in a range between a value '000000' and a value '1000000' in accordance with the following rules.

Rule #1: Order Huffman codes from '000000' in accordance with their length in ascending order (for Huffman codes having the same code length, order them in ascending order of their values).

Rule #2: Each i-bit length code occupies an area of ½ to the i-th power in the aforesaid range (e.g., two i-bit length codes occupies an area of $2 \times (½)^i$).

Figure 7:
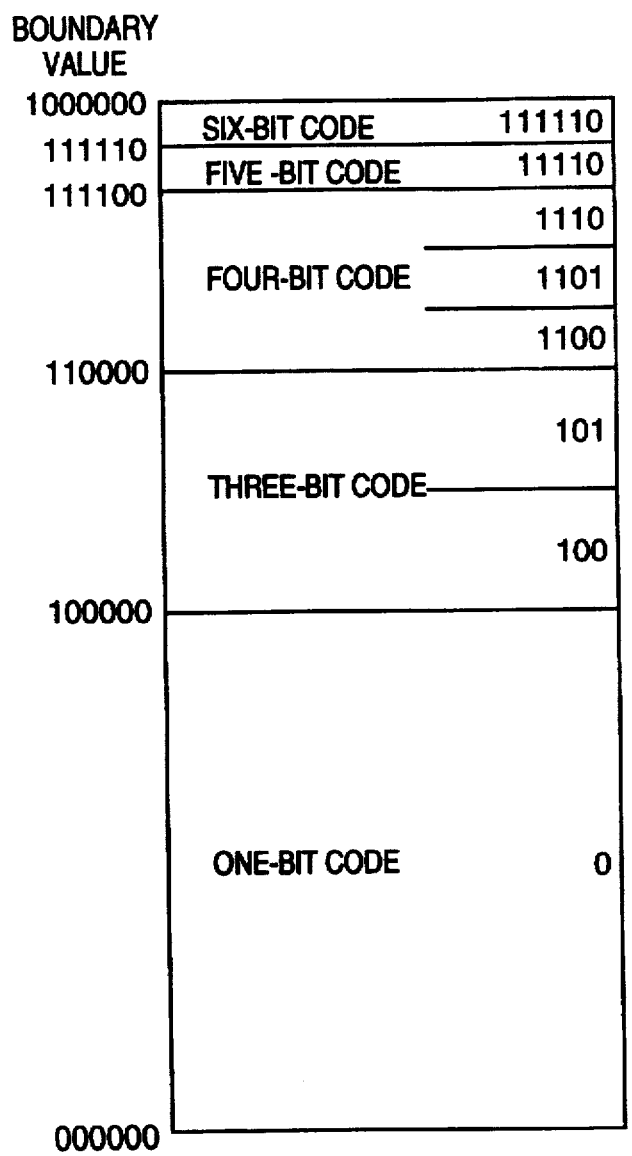
FIG. 7 is an explanatory view showing an area occupied by codes having different bit length to each other.

FIG. 7 is an explanatory view showing an area occupied by codes having different bit lengths to each other when Huffman codes shown in FIG. 5 are ordered in accordance with the aforesaid rules. It is easy to read the boundary values from FIG. 7.

In FIG. 4, reference numerals 401 to 405 denotes registers which store lower boundary values of two- to six-bit signals, respectively. It should be noted that it is not necessary to store a lower boundary value of one-bit code, since it is always '000000' in any coding system. Reference numerals 411 to 415 also denote registers, and store code numbers of Huffman codes which correspond to lower boundary values, which are provided just above the lower boundary values shown in FIG. 7.

Further, reference numeral 420 is a terminal at which a six-bit data including at least one Huffman code is inputted. Reference numerals ≧421 to 425 are subtractors each of which subtracts the lower boundary value stored in registers from a six-bit data inputted into the terminal 420. These subtractors 421 to 425 has two functions; one is for comparing a Huffman code to the plurality of lower boundary values, the other is for calculating differences between the Huffman code and the plurality of lower boundary values. Comparison results are known as sign bits S which are outputted from the five subtractors 421 to 425. Each of the subtractors 421 to 425 performs an operation, (input data)−(boundary value), and, when the sign bit S is '0', then it indicates that the obtained difference is greater or equal to 0. More specifically, when the sign bit S is '0', a relationship (input data)≧(boundary value) holds.

Further, reference numeral 436 denotes an inverter for one bit input, and reference numerals 432 to 435 denote AND gates each of which has an inverted input terminal. By checking which signal is '1' among signals 442 to 446 outputted from the AND gates 432 to 435, and a signal 441 outputted from the subtractor 421, the code length of a Huffman code inputted from the terminal 420 can be determined. More specifically, when the signal 441 is '1', then the input data is smaller than the lower boundary value of a two-bit length code, thus the Huffman code has one bit in length. Further when the signal 442 is '1', then the input data is greater or equal to the lower boundary value of a two-bit length code and smaller than the lower boundary value of a three-bit length code, thus the Huffman code has two bit in length. Similar determination is made when other signal is '1'.

Reference numeral 453 denotes a priority encoder which encodes an input determination result (signals 441 to 446) of six bits, and outputs a three-bit code length signal to a terminal 471.

Further, code numbers from the register 411 to 415 as well as a determination result (signals 442 to 446), as a selection control signal, are inputted into a first selector 451. For example, when the signal 442 is '1', then the first selector 451 selects and outputs a code number inputted from the register 411. Similarly, when the signal 443, 444, 445, or 446 is '1', the first selector 451 respectively selects and outputs a code number inputted from the register 412, 413, 414, or 415.

Further, a six-bit determination result (signals 441 to 446) is inputted as a selection control signal as well as following six kinds of data are inputted as signals from which a single is selected, into a second selector 452. This inputs are:

(1) An output from a shifter 461 (one-bit data obtained by shifting input data to the right by five bits).

(2) An output from a shifter 462 (two-bit data obtained by shifting an output from the subtractor 421 to the right by four bits).

(3) An output from a shifter 463 (three-bit data obtained by shifting an output from the subtractor 422 to the right by three bits).

(4) An output from a shifter 464 (four-bit data obtained by shifting an output from the subtractor 423 to the right by two bits).

(5) An output from a shifter 465 (five-bit data obtained by shifting an output from the subtractor 424 to the right by one bits).

(6) An output from the subtractor 425 (six-bit data).

The second selector 452 selects one of the aforesaid six kinds of data on the basis of the signals 441 to 446, and outputs lower 4 bits of the selected data. A signal outputted from the second selector 452 is obtained by subtracting a lower boundary value corresponding to a code length of a Huffman code, inputted into the terminal 420, which is under decoding process, from the Huffman code, and standardizing the obtained difference. For example, when the signal 441 is '1', the one-bit data outputted from the shifter 461 is selected and outputted as the least significant bit. Further, when the signal 446 is '1', the six-bit data outputted from the subtractor 425 is selected and the lower 4 bits of the six-bit data is outputted. An output from the second selector 452 is used for calculating a code number, and, since the code number has only four bits in length, the output from the second selector 452 does not have to be over four bits. Therefore, in the six-bit data, only the lower 4 bits are outputted with the upper 2 bits ignored.

Reference numeral 473 is an adder which adds an output from the first register 451 to an output from the second register 452 so as to obtain the desired code number, and outputs the result (four bits) to a terminal 475.

[Operation]

Now, an operation of the operation unit 301 shown in FIG. 4 will be explained by using specific data.

Assume that data '111010' is inputted into the terminal 420. This six-bit data is compared with all of the lower boundary values of two- to six-bit signals stored in the registers 401 to 405 in the subtractor 421 to 425. In this case, a comparison with the lower boundary value of a four-bit code, '110000', stored in the register 403 and a comparison with the lower boundary value of a five-bit code, '111100', stored in the register 404, are important. Since the relationship between the input data '111010' and the two lower boundary values, '110000' and '111100', is '110000'<(input data)<'111100', outputted sign bits from the subtractors 423 and 424 are '0' and '1', respectively, therefore only the signal 444 among signals 441 to 446 becomes '1'.

Meanwhile, a value '001010' (='111010'−'110000') is outputted from the subtractor 423, and changed to '0010' after being shifted by the shifter 464 to the right by 2 bits, then inputted into the second selector 452. At this moment, the signal 444 is '1', thus the second selector 452 selects the four-bit data outputted from the shifter 464 and sends it to the adder 473. Similarly, the first selector 451 selects a code number 3 (='0011') inputted from the register 413, and transmits it to the adder 473.

The adder 473 adds the two input signals '0011' and '0010', and outputs the sum '0101' to the terminal 475. Meanwhile, the priority encoder 453 outputs an encoded result '100', obtained by encoding the signals 441 to 446, to the terminal 471 as a code length of a Huffman code.

As described above, a Huffman code in the input six-bit data '111010' inputted into the terminal 420 can be known to have four bits in length and a code number of 5. In the same manner, code lengths and code numbers of other Huffman codes can be obtained by performing the aforesaid operation.

According to the aforesaid configuration, it is possible to minimize memory size required for storing a decoding table and to overcome the aforesaid problems, however, following problems remain.

(1) Since a code number having no redundancy is obtained by only performing operation, the hardware structure of an operation unit becomes large, which increases the cost to produce it.

(2) Since the hardware structure of the operation unit becomes large, operation speed is slow and the rate of decoding operation decreases.

The above two problems can be solved by using an encoder which will be described in following embodiments, for obtaining a code number with redundancy (called as "redundant code number", hereinafter) instead of obtaining a code number with no redundancy. Note, a larger redundant code number is assigned to a fixed-length code which occurs less frequently, as in the case of the aforesaid code number, however, differs from the code number in following points.

(1) A Huffman code of a certain bit length has a plurality of corresponding redundant code numbers.

(2) The number of bits which are greater or equal to the number of bits for expressing a code number is necessary to express a redundant code number.

[First Embodiment]

A brief configuration of an apparatus of the present invention according to a first embodiment is as follow. An operation unit obtains a redundant code number corresponding to the Huffman code to be decoded, and the redundant code number is transformed to an original fixed-length code by referring to a decoding table. The memory size required to store the decoding table somewhat increases comparing to the memory size when using the configuration shown in FIG. 4, however, the apparatus of the first embodiment has smaller hardware structure in the operation unit, thereby down-sizing the hardware of the entire apparatus, and the rate of decoding operation is increased at the same time.

[Configuration]

Figure 8:
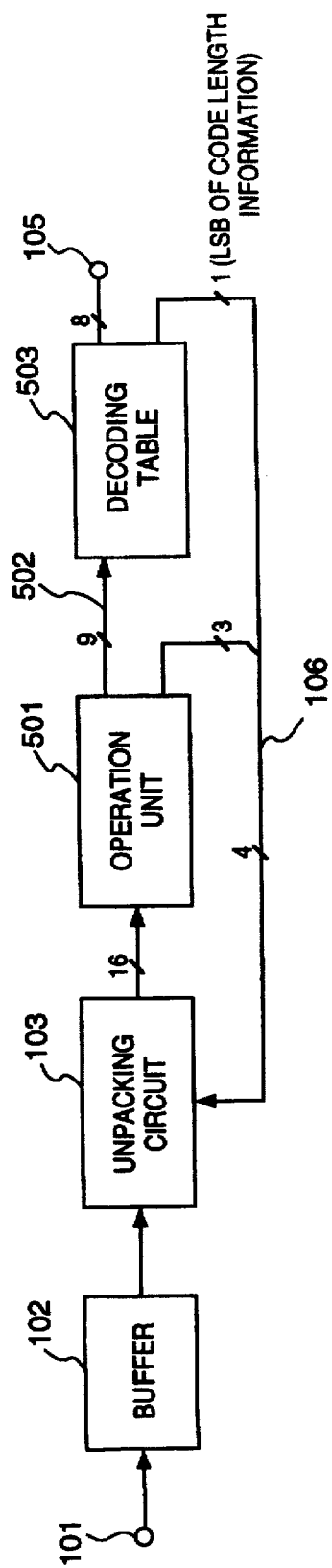
FIG. 8 is a block diagram illustrating a configuration of a decoding apparatus according to a first embodiment.

FIG. 8 is a block diagram showing a configuration of a decoding apparatus according to the first embodiment. In FIG. 8, the same units and elements as those in FIGS. 1 and 3 are referred by the same reference numerals, and explanations of them are omitted. Further, for the sake of easier understanding of comparison between the configuration shown in FIG. 8 and the configurations shown in FIGS. 1 and 3, the same numbers of bits of a Huffman code, code length information, and so on, as in the FIGS. 1 and 3 are used in the first embodiment. Furthermore, in the configuration in FIG. 8, the operation/logic circuit which is used to determine a redundant code number and a code length will be described later with reference to FIG. 9.

Referring to FIG. 8, reference numeral 501 is an operation unit into which a Huffman code is inputted from the unpacking circuit 103 and which obtains a redundant code number 502 of the Huffman code and upper three bits of the code length information 106 by performing logical operations. Further, reference 503 denotes a decoding table, and by referring to the decoding table 503, an eight-bit fixed-length code as well as the least significant bit of the code length information 106 are obtained correspondence to a nine-bit redundant code number signal 502. Thus, the number of the input bits and the number of the output bits to/from the decoding table 503 are both nine bits. Therefore, the memory size required for the decoding table 503 is 576 bytes, as described in a following equation, which is about 1/170 of the memory size for the decoding table 104 (requires 96 kbytes) shown in FIG. 1, and about double of the memory size for the decoding table 303 (requires 256 bytes) shown in FIG. 3.

$$2^9 \times 9 = 512 \times 9 = 4,608 \text{ bits} = 574 \text{ bytes} \qquad (3)$$

As described above, the memory size for the decoding table 503 according to the first embodiment is larger than that required in the configuration shown in FIG. 3. However, the circuit structure of the operation unit 501 can be roughly halved comparing to the configuration shown in FIG. 4, as described below.

Next, a configuration and operation of the operation unit 501 will be described. For simplicity sake, a small circuit for obtaining a four-bit redundant code number and upper two bits of a three-bit code length information from nine combinations of Huffman codes whose maximum lengths are six bits, as in the case of FIG. 4, will be explained as an example. Further, a Huffman code table used in this example is the one shown in FIG. 5.

Figure 9:
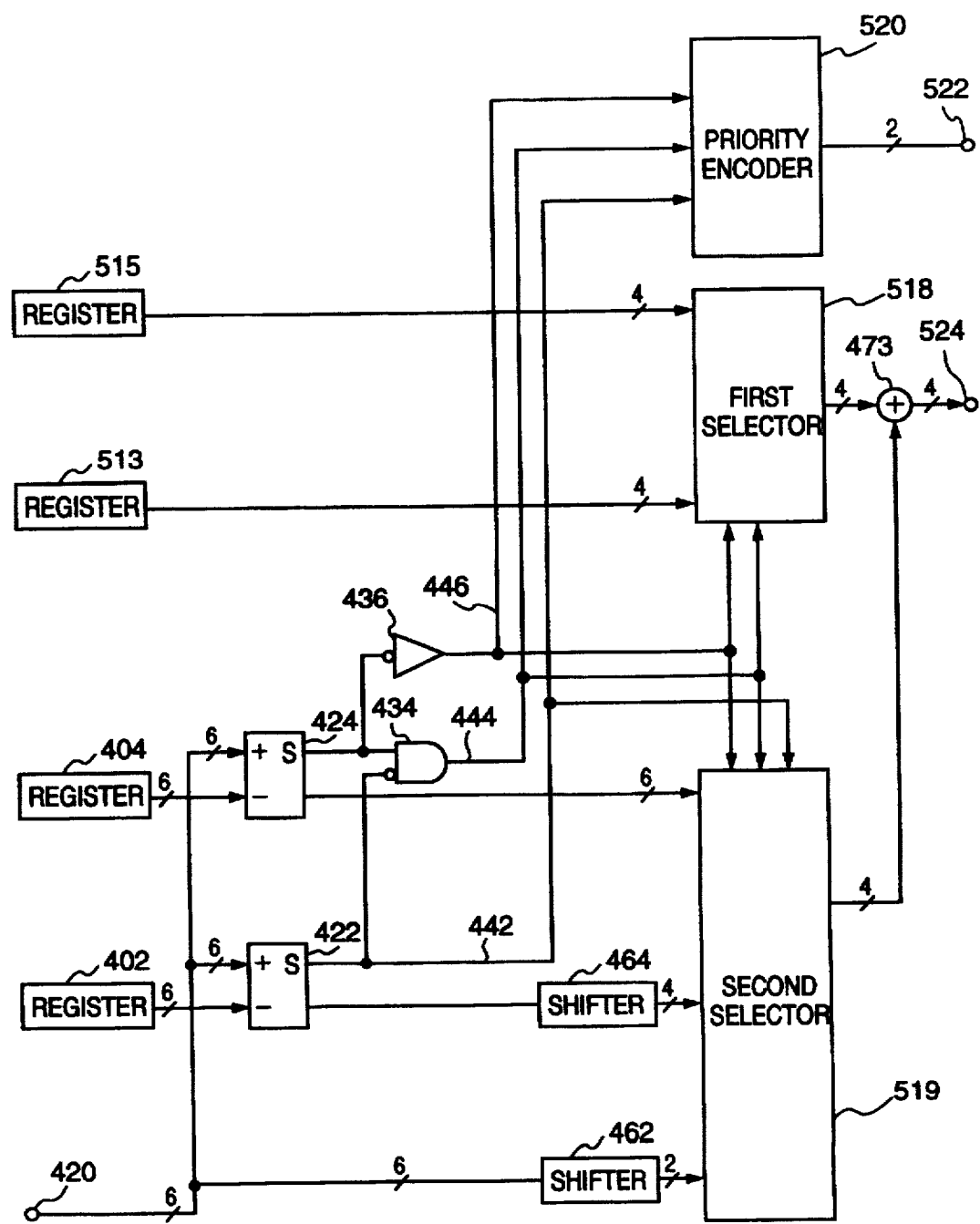
FIG. 9 is a block diagram illustrating a configuration of an operation unit shown in FIG. 8.

FIG. 9 is a block diagram showing a configuration of the operation unit 501, and the same units and elements as those in FIG. 4 are referred by the same reference numerals and explanations of those are omitted. FIG. 10 shows correspondence between Huffman codes and redundant code numbers, and the correspondence will be described later.

In FIG. 9, reference numeral 513 and 515 denote registers which store redundant code numbers each of which corresponds to the lower boundary value of 3-bit code length and the lower boundary value of 5-bit code length, respectively.

In the first embodiment, redundant code numbers corresponding to lower boundary values of codes having odd-number bits in length are stored in registers, and code length of a Huffman code inputted into the terminal 420 is identified by two bits, then a redundant code number is selected on the basis of the identified result. Thereafter, a difference between the input Huffman code and the corresponding lower boundary value is added to the selected redundant code number, thereby obtaining a redundant code number corresponding to the Huffman code. Note, since a redundant code number corresponding to the lower boundary value of a one-bit length code is '0' similarly to the case of the aforesaid code number, it is unnecessary to store it. A purpose of identifying code length of a Huffman code by two bits is for reducing the number of required subtractors which are for obtaining differences between the input Huffman code and the lower boundary values of codes having different bit length to each other, to equal or less than half. Accordingly, Huffman codes can be discriminated into three kinds of groups divided in accordance with conditions, i.e., whether a Huffman code is greater or equal to 2i−1 bits and less or equal to 2i bits (i=1, 2, 3).

Reference numeral 518 denotes a first selector which selects either a redundant code number inputted from the register 513 or a redundant code number inputted from the register 515 in accordance with the aforesaid identified results (signals 444 and 446). More specifically, if length of a Huffman code is three or four bits, an output from the register 513 is selected, whereas if the length of the Huffman code is five or six bits, an output from the register 515 is selected. Note that, when the length of the Huffman code is zero or one bit, then nothing is selected and '0' is outputted. Reference numeral 519 is a second selector which selects one of differences between a Huffman code and each of the corresponding lower boundary values on the basis of the identified results (signals 442, 444, and 446). The outputs from the first and second selectors are added in the adder 473, and the sum is outputted to a terminal 524 as a redundant code number.

Reference numeral 520 is a priority encoder which encodes the above identified result (signals 442, 444, and 446), and outputs the encoded result to a terminal 522 as a upper two bits of three-bit code length information.

[Operation]

Next, an operation of the operation unit 501 shown in FIG. 9 will be described by using specific data.

Assume that data '111010' is inputted into the terminal 420 as in the case described with reference to FIG. 4. As apparent from FIG. 7, the data is larger than the lower boundary value of a three-bit code '100000' which is stored in the register 402 and smaller than the lower boundary value of a five-bit code '111100' which is stored in the register 404. Therefore, it is determined that a Huffman code in the input data is either three bits or four bits in length, and only the signal 444 becomes '1' among signals 442, 444, and 446.

Accordingly, the first selector 518 selects and outputs an output from the register 513 (stored content indicates "2"). Further, the second selector 519 selects and outputs a value '0110' (=6) which is obtained from the difference between the input data '111010' and the lower boundary value '100000' of a three-bit length Huffman code by using the subtractor 422, then shifting the obtained difference '011010' to the right by 2 bits by using the shifter 464. The adder 473 adds the outputs from the first and second selectors, and outputs the sum (6+2=8) into the terminal 524 as a redundant code number. The redundant code number "8" corresponds to a Huffman code of '1110' which is the upper 4 bits of the input data '111010' as described in FIG. 10.

Meanwhile, the priority encoder 520 outputs the result '02' obtained by encoding signals 442, 444, and 446 to the terminal 522 as upper 2 bits of a code length signal. In accordance with the redundant code number outputted from the terminal 524, the least significant bit '1' of the code length signal is obtained by referring to the decoding table 603. Thereafter, the upper two-bit signal and the least significant bit are combined to make a three-bit signal '011' (=3) as code length information. Note that, in the first embodiment, a system of expressing a code length with (bit length 1) was adopted, thus the actual code length is 4 bits.

As described in FIG. 10, when code length of a Huffman code is an even-number of bits, a single redundant code number corresponds to the Huffman code, whereas, when code length of a Huffman code is an odd-number of bits, two redundant code numbers correspond to the Huffman code. The reason of this is that, as apparent from above explanation, a Huffman code to be decoded is processed by two bits, thus a Huffman code having odd-number bits in length has to be attached with an extra bit to have even number of bits so as to be decoded by two bits. Since redundant code numbers differ depending upon whether the attached one bit is '1' or '0', two different redundant code numbers correspond to a single Huffman code having odd-number bits in length.

It should be noted that the aforesaid embodiment describes a case where a Huffman code to be decoded is processed by two bits, however, the present invention is not limited to this. It is also possible to process a Huffman code by four or more bits. In a case where decoding process is performed by 4 bits, for example, the number of subtractor is reduced to about ¼ of those in the operation unit shown in FIG. 4, and the circuit structure of the operation unit can be reduced further. However, the number of bits of a redundant code number increases by two bits compared to that of a code number with no redundancy, the required memory size to store a decoding table increases by $2^2$ times, namely four times. Still, memory size of the decoding table is 1 kbytes, which is 1/96 of the decoding table 104 (requires 96 kbytes) shown in FIG. 1.

It should be noted that, when a plurality of decoding tables are necessary to be stored simultaneously, since the effect of increase of required memory size for storing a decoding table is more serious to the hardware structure of the entire apparatus than the effect of reduction of the circuit structure of the operation unit, it is preferred to process a Huffman code by the smaller number of bits.

According to the first embodiment as described above, because a part of code length information of a Huffman code and a predetermined redundant code number is obtained by performing logical operations and the code number obtained by referring to a decoding table is transformed into a fixed-length code which is an original form of the code and into the rest of the code length information, the memory size required for storing the decoding table as well as circuit structure of the operation unit can be reduced, thereby decoding a Huffman code at high speed.

[Second Embodiment]

A decoding apparatus according to a second embodiment will be described below. In the second embodiment, the same units and elements as those in the first embodiment are referred by the same reference numerals, and explanations of them are omitted.

A feature of the following second embodiment is that all the code length, from the most significant bit to the least significant bit, are obtained in an operation unit which generates redundant code numbers.

[Configuration]

Figure 11:
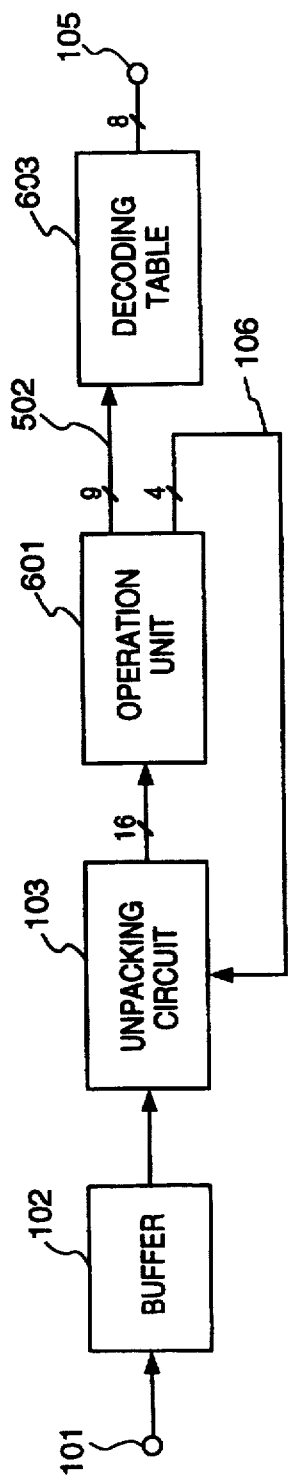
FIG. 11 is a block diagram illustrating a configuration of a decoding apparatus according to a second embodiment.

FIG. 11 is a block diagram showing a configuration of a decoding apparatus of the second embodiment. In FIG. 11, the same units and elements as those in FIGS. 1, 3, and 8 are referred by the same reference numerals, and explanations of them are omitted. Further, in order to compare the configuration shown in FIG. 11 to the configuration shown in FIGS. 1, 3, and 8, the number of bits of a Huffman code and the number of bits of code length information in this embodiment are the same as those described above with reference to FIGS. 1, 3, and 8. Furthermore, in the configuration shown in FIG. 11, the operation/logic circuit is used to determine a code number and a code length will be described later with reference to FIG. 12.

In FIG. 11, reference numeral 601 denotes an operation unit to which a Huffman code is inputted from the unpacking circuit 103 and which obtains a redundant code number and code length information (4 bits) of the input Huffman code by performing logical operations. Reference 603 denotes a decoding table, and by referring to the decoding table 603, an eight-bit fixed-length code is obtained correspondence to a nine-bit redundant code number signal 502. Therefore, memory size required to store the decoding table 603 is 512 bytes as described in the following equation. Accordingly, 1/192 of the memory size required to store the decoding table 104 (requires 96 kbytes) shown in FIG. 1, or double of the memory size required to store the decoding table 303 (requires 256 bytes) shown in FIG. 3 is necessary to store the decoding table 603.

$$2^9 \times 8 = 512 \times 8 \ bits = 512 \ bytes \quad (4)$$

Next, a configuration of the operation unit 601 and its operation will be described. For the simplicity sake, a small circuit for obtaining a four-bit redundant code number and three-bit code length information from nine combinations of Huffman codes whose maximum lengths are 6 bits will be described. Further, the Huffman code table shown in FIG. 5 is used in the second embodiment, and a redundant code number is obtained on the basis of identified results obtained by identifying code length of a Huffman code by 2 bits. Therefore, correspondence between Huffman codes and redundant code numbers is the same as that of the first embodiment (refer to FIG. 10).

Figure 12:
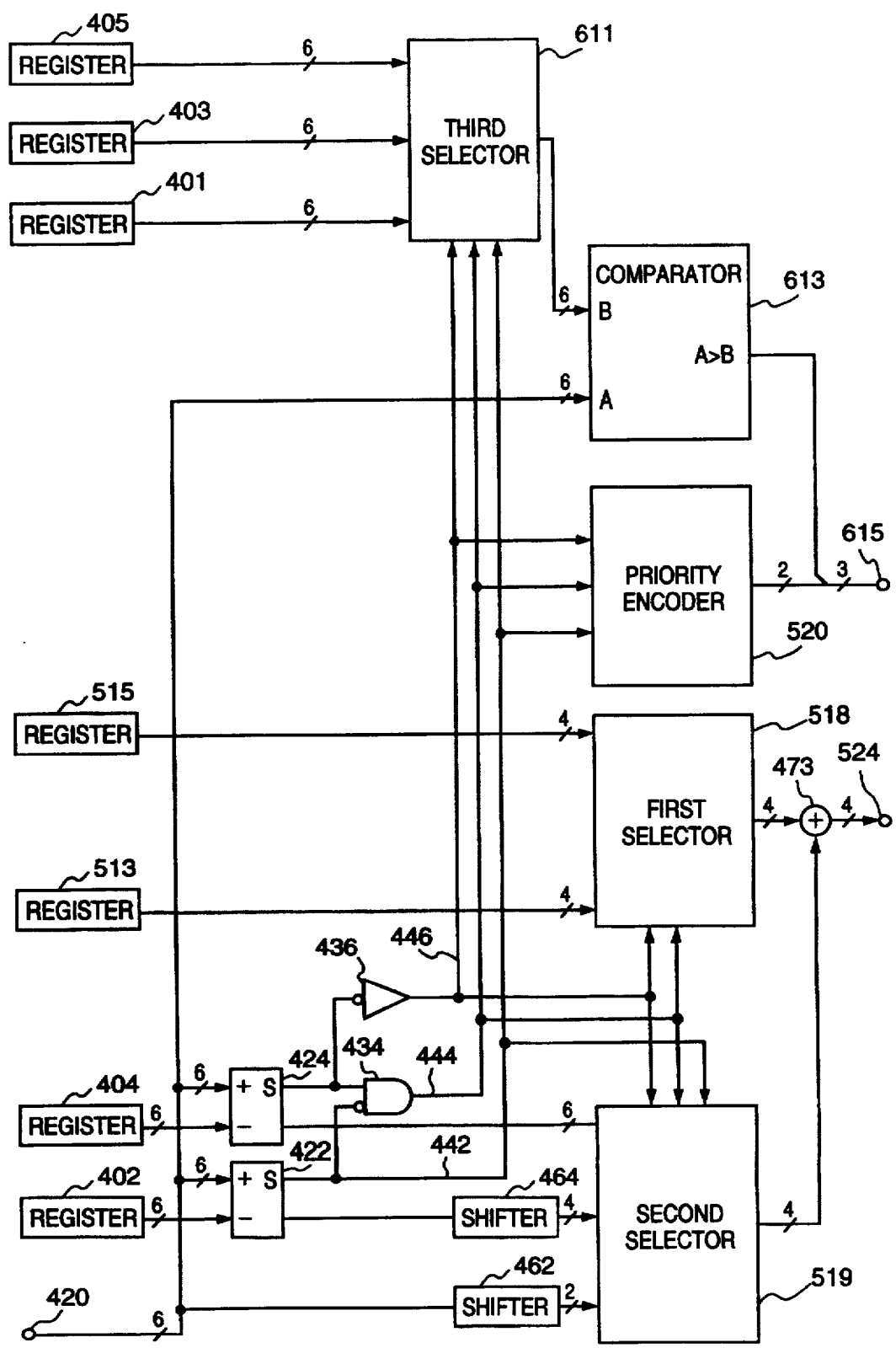
FIG. 12 is a block diagram illustrating a configuration of an operation unit shown in FIG. 11.

FIG. 12 is a block diagram showing a configuration of the operation unit 601, and the same units and elements as those in FIGS. 4 and 9 are referred by the same reference numerals, and explanations of them are omitted.

In FIG. 12, reference numeral 611 denotes a third selector which selects one of the lower boundary values of two-, four-, and six-bit codes respectively outputted from the registers 401, 403, and 405 on the basis of the identified result (signals 442, 444, and 446). Further, reference numeral 613 denotes a comparator which compares the lower boundary value selected by the third selector 611 and an input data, and generates the least significant bit for code length information. The least significant bit is attached to the upper 2 bits of code length information which is outputted from the priority encoder 520, and the code length information of 3 bits are outputted from the terminal 615.

[Operation]

Next, an operation of the operation unit 601 shown in FIG. 12 will be described by using specific data. Note that circuits for operating a redundant code number, such as the first selector 518, the second selector 519, and the priority encoder 520, are the same as those expressed in the first embodiment with reference to FIG. 9, thus explanations of operations at those circuits are omitted.

Assume that data '111010' is inputted into the terminal 420 as in the case described with reference to FIG. 9. Since three input signals, 442, 444, and 446 are respectively '0', '1', and '0', the third selector 611 selects and outputs the lower boundary value of a four-bit code '110000' stored in the register 403. Since the input data '111010' is larger than the output from the third selector 61', the comparator 613 outputs '1' which is attached as the least significant signal to a two-bit signal '02' outputted from the priority encoder 520, and the obtained three-bit signal '011' is outputted from the terminal 615 as code length information.

According to the second embodiment as described above, the same advantage as in the first embodiment can be obtained, and in addition, the required memory size for storing the decoding table of the second embodiment can be reduced comparing to the required memory size for the decoding table of the first embodiment by adding little more element to the operation unit of the first embodiment. The second embodiment is particularly advantageous in a case, for example, where plural kinds of decoding tables are to be stored simultaneously.

<Other Embodiment>

The present invention can be applied to a system constituted by a plurality of devices (e.g., host computer, interface, reader, printer) or to an apparatus comprising a single device (e.g., copy machine, facsimile).

Further, the object of the present invention can be also achieved by providing a storage medium storing program codes for performing the aforesaid processes to a system or an apparatus, reading the program codes with computer (e.g., CPU, MPU) of the system or apparatus from the storage medium, then executing the program.

In this case, the program codes read from the storage medium realize the functions according to the embodiments, and the storage medium storing the program codes constitutes the invention.

Further, the storage medium, such as a floppy disk, a hard disk, an optical disk, a magneto-optical disk, CD-ROM, CD-R, a magnetic tape, a non-volatile type memory card, and ROM can be used for providing the program codes.

Furthermore, besides aforesaid functions according to the above embodiments are realized by executing the program codes which are read by a computer, the present invention includes a case where an OS or the like in the computer performs a part or entire processes in accordance with designations of the program codes and realizes functions according to the above embodiments.

Furthermore, the present invention also includes a case where, after the program codes read from the storage medium are written in an expansion card which is inserted into the computer or in a memory provided in a function extension unit which is connected to the computer, CPU or the like contained in the expansion card or unit performs a part or entire process in accordance with designations of the program codes and realizes functions of the above embodiments.

The present invention is not limited to the above embodiments and various changes and modifications can be made within the spirit and scope of the present invention. Therefore, to apprise the public of the scope of the present invention the following claims are made.

What is claimed is:

1. A decoding device comprising:
   computing means for obtaining a part of code length information of an input code which has plural bits and a predetermined code number corresponding to said input code; and transformation means for transforming the code number obtained by said computing means into a fixed-length code and a rest of said code length information.

2. The device according to claim 1, wherein said input code is a variable length code.

3. The device according to claim 1, wherein said code number is a redundant code number.

4. The device according to claim 1, wherein said computing means includes:

storage means for storing a plurality of pairs, a boundary value of a code and a code number, corresponding to the respective boundary values by a predetermined code length;

determination means for determining a range of code length of said input code on the basis of comparison results between each of the plurality of boundary values stored in said storage means and said input code;

subtracting means for obtaining a difference between said input code and one of said boundary values, stored in said storage means, corresponding to the range of code length obtained by said determination means;

selecting means for selecting one of the code numbers stored in said storage means on the basis of the range of code length; and adding means for adding the difference obtained by said subtracting means and the code number selected by said selecting means, and obtaining a code number corresponding to said input code.

5. The device according to claim 4, wherein said computing means further includes generating means for generating a part of said code length information from the range of code length obtained by said determination means.

6. The device according to claim 4, wherein said storage means stores pairs of lower boundary values of codes and redundant code numbers respectively corresponding to the lower boundary values by code length of even-number bit.

7. The device according to claim 1, wherein said transformation means is a decoding table stored in a memory.

8. The device according to claim 1, further comprising:

input means for inputting a code; and unpacking means for providing a predetermined number of bits of data extracted from the code inputted by said input means to said operation means as the input code on the basis of the part of code length information obtained by said operation means and the rest of the code length information obtained by said transformation means.

9. A decoding device comprising:

input means for inputting a code:

unpacking means for outputting a predetermined number of bits of data extracted from the code input by said input means on the basis of provided code length information;

computing means for obtaining code length information of the data output by said unpacking means and a predetermined code number corresponding to the data output by said unpacking means, and for providing the code length information to said unpacking means; and transformation means for transforming the code number obtained by said computing means into a fixed-length code.

10. The device according to claim 9, wherein said code is a variable length code.

11. The device according to claim 9, wherein said code number is a redundant code number.

12. The device according to claim 9, wherein said computing means includes:

storage means for storing a plurality of pairs of boundary values of codes and code numbers corresponding to the respective boundary values of a predetermined code length;

determination means for determining a range of code length of the data output by said unpacking means on the basis of comparison results between each of the plurality of boundary values stored in said storage means and the data output by said unpacking means;

subtracting means for obtaining a difference between the data output by said unpacking means and one of said boundary values, stored in said storage means, corresponding to the range of code length obtained by said determination means;

selecting means for selecting one of the code numbers stored in said storage means and one of the boundary values on the basis of the range of code length; and adding means for adding the difference obtained by said subtracting means and the code number selected by said selecting means, and obtaining a code number corresponding to the data.

13. The device according to claim 12, wherein said computing means further includes generating means for generating said code length information from a comparison result between the boundary value selected by said selecting means and the data outputted by said unpacking means, and the range of code length obtained by said determination means.

14. The device according to claim 12, wherein said storage means stores a plurality of pairs of lower boundary values of codes and redundant code numbers respectively corresponding to the lower boundary values for even number of bit code length.

15. The device according to claim 9, wherein said transformation means is a decoding table stored in a memory.

16. A decoding method comprising the steps of:

obtaining a part of code length information of an input code having plural bits;

obtaining a predetermined code number corresponding to said input code; and transforming the obtained code number into a fixed-length code and a rest of said code length information.

17. A decoding method comprising:

an input step of inputting a code;

an unpacking step of extracting a predetermined number of bits of data from the code inputted at said input step;

a first computing step of computing a part of code length information of the predetermined number of bits of data extracted at said unpacking step;

a second computing step of obtaining a predetermined code number corresponding to the predetermined number of bits of data; and a transformation step of transforming the code number obtained at said second computing step into a fixed-length code and a rest of said code length information, wherein, at said unpacking step, the predetermined number of bits of data is extracted from the code inputted at said input step on the basis of a part of code length information obtained at said first computing step and a rest of the code length information obtained at said transformation step.

18. A decoding method comprising:

an input step of inputting a code;

an unpacking step of extracting a predetermined number of bits of data from the code inputted at said input step;

a first computing step of computing code length information of the predetermined number of bits of data extracted at said unpacking step;

a second computing step of obtaining a predetermined code number corresponding to the predetermined number of bits of data; and a transformation step of transforming the code number obtained at said second computing step into a fixed-length code, wherein at said unpacking step, the predetermined number of bits of data is extracted from the code inputted at said input step on the basis of code length information obtained at said first computing step.

19. A decoding device comprising:

input means for inputting a code;

unpacking means for outputting a predetermined number of bits of data extracted from the code inputted by said input means on the basis of a provided part of code length information and a provided rest of code length information;

computing means for obtaining and providing a part of code length information of the data outputted by said unpacking means and a predetermined code number corresponding to the data; and transformation means for transforming the code number provided by said computing means into a fixed-length code and a rest of the code length information to be provided.

20. A decoding device according to claim 1, further comprising:

supplying means for supplying the input code to said computing means in a unit of a predetermined number of bits, the predetermined number being greater than one, wherein said computing means obtains the part of the code length information and the predetermined code number by processing the input code in the unit of the predetermined number of bits supplied by said supplying means.

* * * * *

UNITED STATES PATENT AND TRADEMARK OFFICE
CERTIFICATE OF CORRECTION

PATENT NO. : 5,801,650

DATED : September 1, 1998

INVENTOR(S) : TADAYOSHI NAKAYAMA

It is certified that error appears in the above-identified patent and that said Letters Patent is hereby corrected as shown below:

COLUMN 6

Line 14, "has two bit" should read --is two bits--.

COLUMN 10

Line 4, "'02'" should read --'01'--.

COLUMN 13

Line 46, "operation" should read --computing--.
    Line 48, "operation" should read --computing--.

Signed and Sealed this

Fifteenth Day of June, 1999

Attest:

Attesting Officer

Q. TODD DICKINSON

Acting Commissioner of Patents and Trademarks